US007005308B2

(12) United States Patent
Abe

(10) Patent No.: US 7,005,308 B2
(45) Date of Patent: Feb. 28, 2006

(54) ELECTRO-OPTIC DEVICE, METHOD TO MANUFACTURE THE SAME AND ELECTRONIC APPARATUS

(75) Inventor: Hiroyuki Abe, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 9 days.

(21) Appl. No.: 10/808,339

(22) Filed: Mar. 25, 2004

(65) Prior Publication Data

US 2004/0224456 A1  Nov. 11, 2004

(30) Foreign Application Priority Data

Mar. 27, 2003  (JP) ............................. 2003-088064

(51) Int. Cl.
*H01L 21/00* (2006.01)
(52) U.S. Cl. ..................... 438/22; 438/30; 250/208.1
(58) Field of Classification Search ................ 438/22, 438/28, 29, 30, 34; 250/208.1, 208.2, 216
See application file for complete search history.

(56) References Cited

U.S. PATENT DOCUMENTS 3,862,017 A * 1/1975 Tsunemitsu et al. ........ 205/124
5,340,978 A * 8/1994 Rostoker et al. .......... 250/208.1
5,451,766 A * 9/1995 Van Berkel ............. 250/208.1

FOREIGN PATENT DOCUMENTS

| JP | 11-283752 | 10/1999 |
|----|-----------|---------|
| JP | A 11-281943 | 10/1999 |
| JP | 2001-242803 | 9/2001 |
| JP | 3328297 | 7/2002 |
| JP | 2003-84687 | 3/2003 |
| JP | 2004-241617 | 8/2004 |

\* cited by examiner

*Primary Examiner*—Phuc T. Dang
(74) *Attorney, Agent, or Firm*—Oliff & Berridge, PLC

(57) ABSTRACT

To provide an organic EL display capable of displaying an accurate color and reducing or preventing a decrease in light transmittance, an organic EL display includes a display portion having a plurality of organic EL elements arrayed therein, a circuit element portion having second thin film transistors serving as switching elements for the respective organic EL elements, and a first underlying protective film made of a silicon nitride film formed between the circuit element portion and the transparent substrate. The first underlying protecting film has a plurality of apertures formed corresponding to the positions of the respective organic EL elements.

9 Claims, 9 Drawing Sheets

(a)

(b)

ELECTRO-OPTIC DEVICE, METHOD TO MANUFACTURE THE SAME AND ELECTRONIC APPARATUS

BACKGROUND OF THE INVENTION

1. Field of Invention

The present invention relates to an electro-optic device, a method to manufacture the same, and an electronic apparatus.

2. Description of Related Art

The development of a spontaneously light emitting organic EL display as a display using an organic electroluminescence element (hereinafter "organic EL element") has recently progressed. A related art display includes a plurality of pixel regions arranged in a matrix, and an organic EL element of one of red, green, and blue formed in each of the pixel regions. Each organic EL element together with a switching element to drive it, is formed on a surface of a transparent substrate.

In the related art display, each of an underlying protective film and an interlayer insulating film typically includes a silicon oxide ($SiO_2$) film. However, the use of a silicon nitride (SiN) film has recently been investigated. Silicon nitride has the same degree of resistivity as that of silicon oxide and a denser molecular structure than that of silicon oxide. Therefore, the silicon nitride film can restrict movable ion migration which cannot be prevented by the silicon oxide film. Accordingly, the silicon nitride film can be made thinner than the silicon oxide film, thereby causing the advantage that the display can be thinned. See Japanese Unexamined Patent Application Publication No. 11-281943.

SUMMARY OF THE INVENTION

However, a silicon nitride film is not completely transparent, and assumes light blue. Therefore, when light emitted from a light emitting element passes through the silicon nitride film and is emitted from a transparent substrate, a blue color is added to the light from the light emitting elements. Thus, the organic EL display has the problem of failing to display an accurate color. In this case, in order to display an accurate color, another coating or film must be formed together with the silicon nitride film, to correct a color. Therefore, the manufacturing cost is increased, and thinning of the organic EL display becomes difficult.

There is also the problem that the silicon nitride film assumes a light blue color and decreases the transmittance of light emitted from the light emitting element. Furthermore, when a color correcting film is formed, the transmittance is significantly decreased.

The present invention addresses the above problem. The present invention provides an electro-optic device that displays an accurate color without decreasing transmittance, a method to manufacture the electro-optic device, and an electronic apparatus.

In order to achieve the above, an electro-optic device of an aspect of the present invention includes a display portion having a plurality of display elements arranged on a transparent substrate, and a silicon nitride film formed between the display portion and the transparent substrate, the silicon nitride film having a plurality of apertures corresponding to the positions of the respective display elements. Each of the display elements may be an organic EL element. In this configuration, light from each display element passes through the corresponding aperture and is then emitted from the transparent substrate. Thus the light does not pass through the silicon nitride film. Therefore, the light from each display element is emitted without any change. As a result, an accurate color can be displayed, and a decrease in transmittance can be reduced or prevented.

The silicon nitride film may be an underlying protective film formed between the transparent substrate and a driver element portion in which a switching element is formed for each display element. The open size of each of the apertures may be larger than the display size of each display element. In this configuration, light emitted from each display element is not incident on the underlying protective film even when the aperture position is shifted from the position of the corresponding display element. Therefore, the apertures can be formed by photolithography after alignment of a photomask without using alignment marks. Accordingly, the alignment marks need not be formed separately to simplify the manufacturing process.

The silicon nitride film may be an interlayer insulating film formed between the display portion and a driver element portion in which a switching element is formed for each display element. The open size of each of the apertures is preferably equal to the display size of each display element. Since the interlayer insulating film is disposed near the display elements, light leakage can be reduced or prevented when the open size is equal to the display size.

Furthermore, the surface of a pixel electrode to supply a current to each display element preferably has a recess corresponding to the position of each aperture. Each display element is formed at the bottom of the recess. In this configuration, each display element is disposed nearer to the transparent substrate by a length corresponding to the thickness of the silicon nitride film, as compared with a case in which the silicon nitride film has no aperture. Therefore, the electro-optic device can be thinned.

A method to manufacture an electro-optic device of an aspect of the present invention is a method to manufacture an electro-optic device including a display portion having a plurality of organic EL elements arranged on a display side of a transparent substrate, and a silicon nitride film formed between the display portion and the transparent substrate. The method includes forming the silicon nitride film on the display side of the transparent substrate, forming a plurality of apertures in the silicon nitride film so that the apertures correspond to the positions of the respective organic EL elements, forming a plurality of pixel electrodes on the display side of the silicon nitride film so that the pixel electrodes have recesses corresponding to the positions of the respective apertures, and forming the organic EL elements at the bottoms of the respective recesses. As a result, an accurate color can be displayed, and a decrease in transmittance can be reduced or prevented.

An electronic apparatus of an aspect of the present invention includes the above-described electro-optic device. Therefore, an electronic apparatus having the above effect can be provided.

DETAILED DESCRIPTION OF EXEMPLARY EMBODIMENTS

Exemplary embodiments of the present invention will be descried below with reference to the drawings. In each of the drawings used in the description below, the contraction scale of each member is appropriately changed for making each member recognizable.

First Exemplary Embodiment

First, an organic EL display according to a first exemplary embodiment of an electro-optic device of the present invention will be described.

Figure 1:
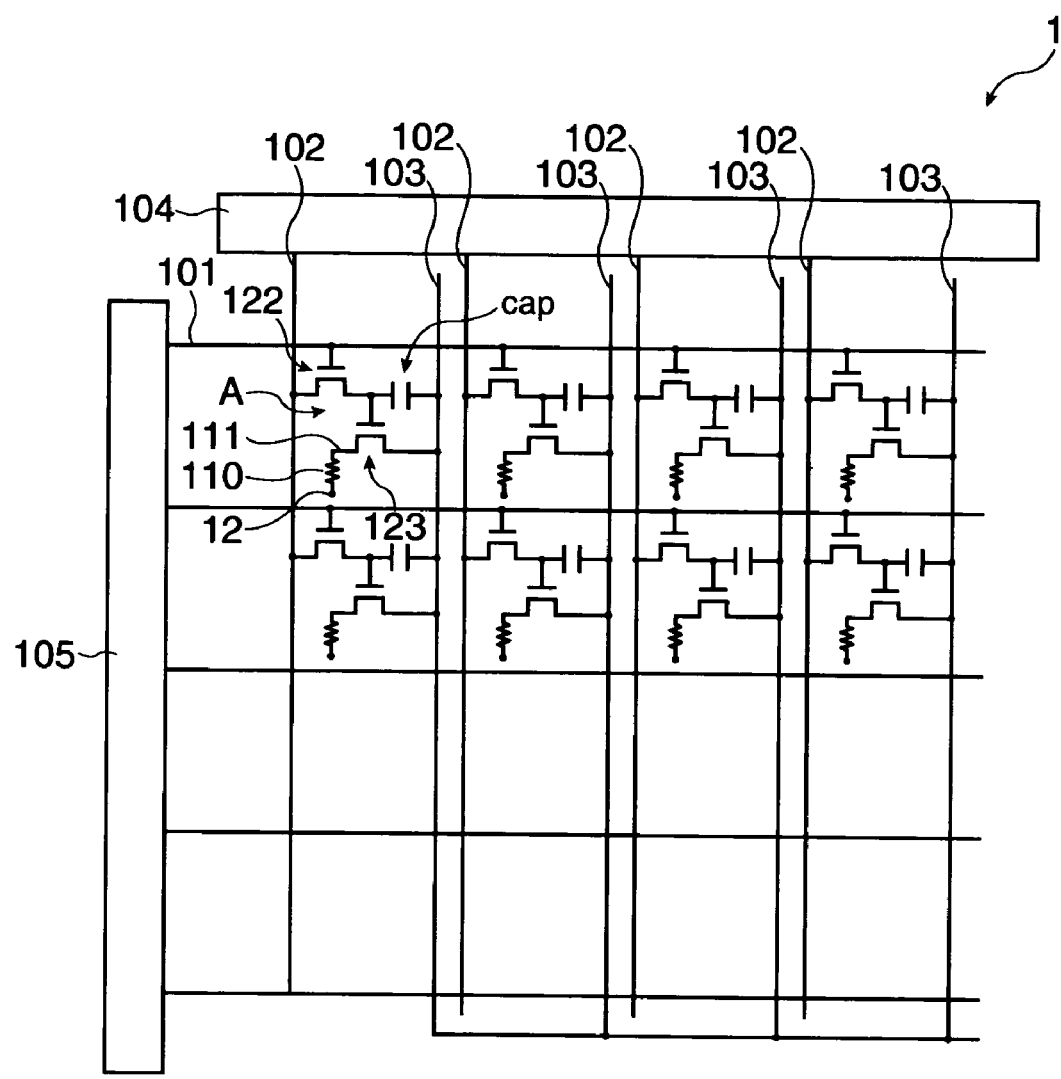
FIG. 1 is a schematic showing equivalent circuits of an organic EL display.
Figure 2:
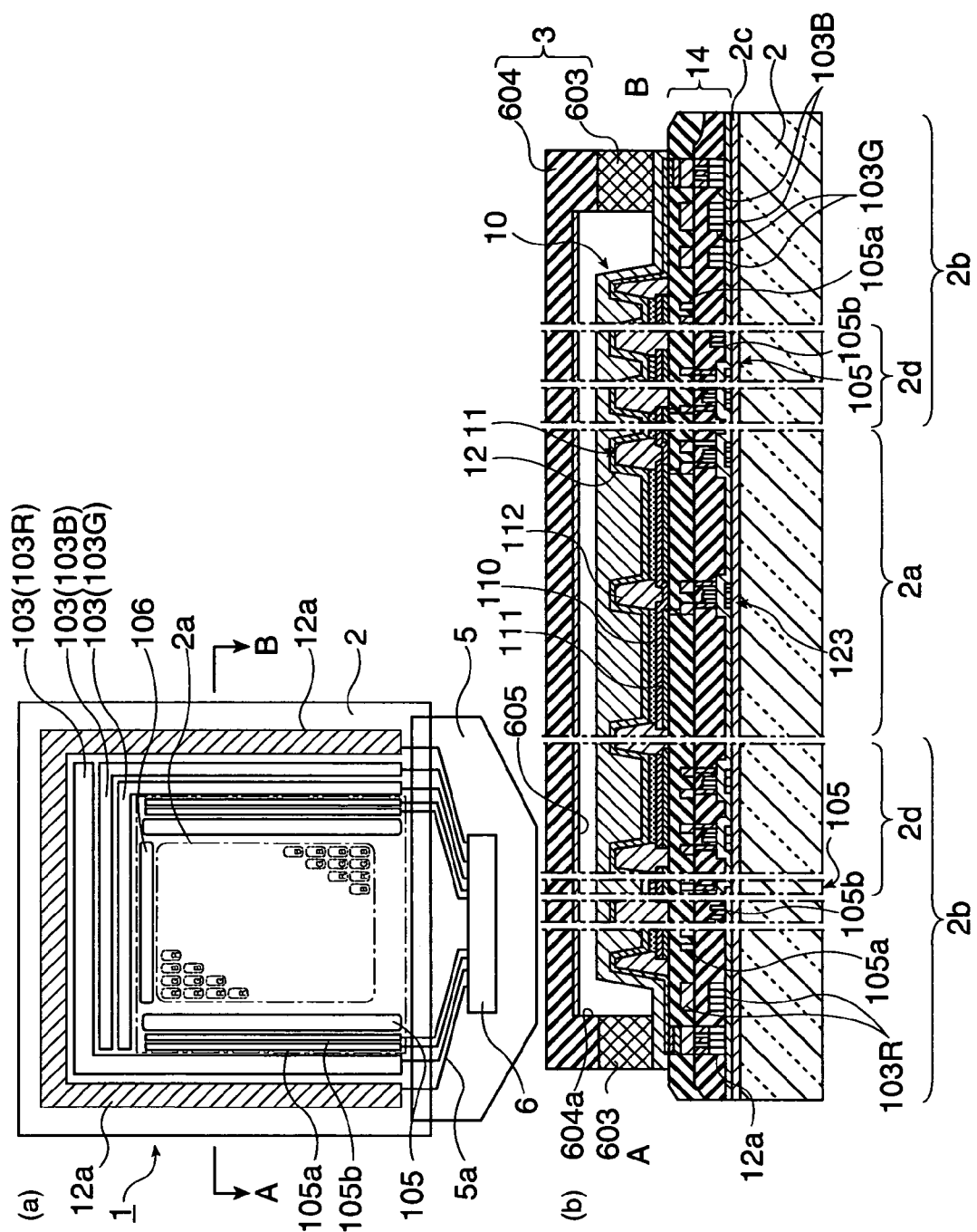
FIG. 2(*a*) is a schematic of an organic EL display, and FIG. 2(*b*) is a sectional schematic taken along plane A-B in FIG. 2(*a*);.
Figure 3:
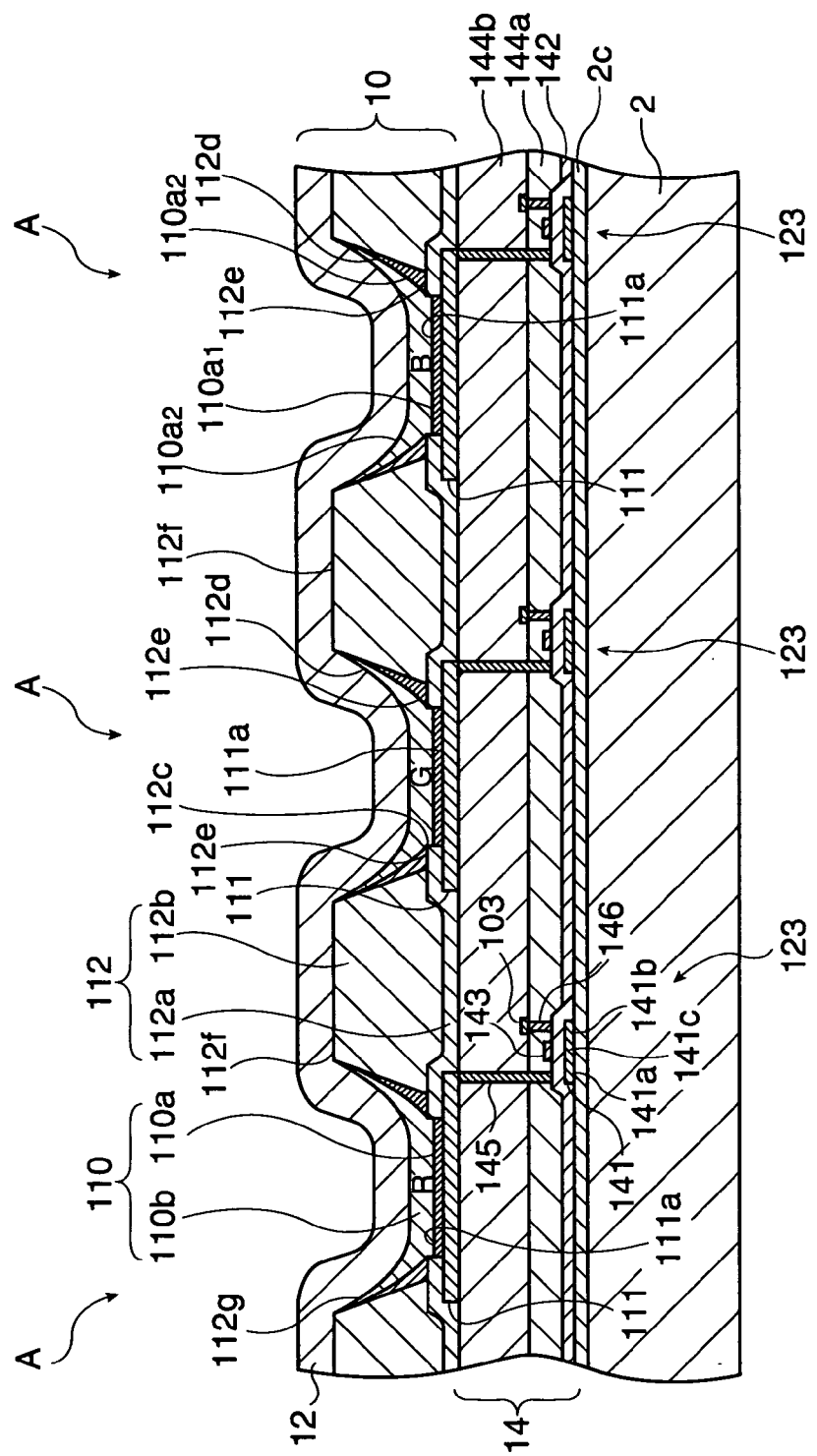
FIG. 3 is an enlarged view of the display regions shown in FIG. 2(*b*)

FIG. 1 is a schematic showing equivalent circuits of the organic EL display. FIG. 2(a) is a schematic, and FIG. 2(b) is a sectional side view taken along plane A–B in FIG. 2(a). FIG. 3 is an enlarged view of the display regions shown in FIG. 2(b). In this exemplary embodiment, an active matrix display is described as an example.

Equivalent Circuit

As shown in FIG. 1, the organic EL display 1 of this exemplary embodiment includes an arrangement of a plurality of scanning lines 101, a plurality of signal lines 102 extending in a direction crossing the scanning lines 101, and a plurality of power lines 103 extending in parallel with the signal lines 102. The scanning lines 101 are connected to a scan driving circuit 105 including a shift register and a level shifter. The signal lines 102 are connected to a data driving circuit 104 including a shift register, a level shifter, a video line and an analogue switch.

Also, a pixel region A is provided near each of the intersections of the scanning lines 101 and the signal lines 102. Furthermore, a first thin film transistor 122 is formed in each of the pixel regions A. The gate of the first thin film transistor 122 is connected to the corresponding scanning line 101 to receive a scanning signal supplied therefrom. The source of the first thin film transistor 122 is connected to the corresponding signal line 102 to receive a pixel signal supplied therefrom. Furthermore, a hold capacitor cap is connected to the drain of the first thin film transistor 122. The hold capacitor cap holds the pixel signal supplied through the corresponding first thin film transistor 122.

On the other hand, a second thin film transistor 123 is formed in each of the pixel regions A. The gate of the second thin film transistor 123 is connected to the corresponding hold capacitor cap to receive a pixel signal held by the hold capacitor cap. The source of the second thin film transistor 123 is connected to the corresponding power line 103 to receive a driving current supplied therefrom. A pixel electrode (anode) 111 is connected to the drain of the corresponding second thin film transistor 123. Furthermore, an organic EL element (hereinafter "light emitting element") 110 is formed as a display element between the pixel electrode 111 and a counter electrode (cathode) 12.

In this configuration, when a scanning signal is supplied from one of the scanning lines 101 to turn the corresponding first thin film transistor 122 on, the potential of the corresponding signal line 102 is held in the hold capacitor cap. Furthermore, the on/off state of each of the second thin film transistors 123 depends upon the state of the corresponding hold capacitor cap. When each of the second thin film transistors 123 is turned on, a driving current is supplied from the corresponding power line 103 to the pixel electrode 111. The driving current flows into the cathode 12 through the light emitting elements 110 to emit light from the light emitting elements 110 according to the quantity of the driving current.

Planar Structure and Sectional Structure

As shown in FIGS. 2(a) and 2(b), the organic EL display 1 includes a transparent substrate 2 made of glass or the like, a circuit element portion 14 in which thin film transistors and various wirings are formed, a display portion 10 in which light emitting elements 110 and banks 112 are formed, a flexible substrate 5 on which a driving IC 6 is mounted, and a sealing portion 3 to hermitically sealing the display portion 10.

As shown in FIG. 2(a), a display region 2a is formed at the center of the transparent substrate 2. In the display region 2a, the above-described light emitting elements 110 are arranged in a matrix. Also, an inspection circuit 106 is disposed adjacent to the display region 2a, to inspect the quality and defects of the display in the course of manufacture and at the time of shipping. As shown in FIG. 2(b), a non-display region 2b is formed outside the display region 2a to be disposed at the end of the transparent substrate 2. In the non-display region 2b, a dummy display region 2d is formed near the display region 2a.

The circuit element portion 14 is formed on the transparent substrate 2. The above-described scanning lines, signal lines, hold capacitors and first thin film transistors (not shown in FIG. 2), and the second thin film transistors 123 are formed in the display region 2a of the circuit element portion 14. Also, the above-described scan driving circuit 105 is disposed outside the display region 2a of the circuit element portion 14. Furthermore, a driving circuit power wiring 105b and driving circuit control signal wiring 105a are disposed outside the scan driving circuit 105 and connected to the scan driving circuit 105. Furthermore, the power lines 103 (103R, 103G and 103B) are disposed outside the driving circuit control signal wiring 105a. In FIG. 2, the power line 103R to supply a driving current to the red (R) light emitting elements is disposed on one of the sides of the display region 2a. The power lines 103G and 103B to supply a driving current to the green (G) light emitting elements and blue (B) light emitting elements, respectively, are disposed on the other side of the display region 2a. Furthermore, cathode wiring 12a is formed outside the power lines 103, the cathode 12 being connected to the cathode wiring 12a.

As shown in FIG. 2(a), the flexible substrate 5 is connected to the end of the transparent substrate 2. A plurality of wirings 5a is formed on the surface of the flexible substrate 5, and the driving IC 6 (driving circuit) is mounted on an end of each wiring 5a. The other end of each wiring 5a is connected to the driving circuit power wiring 105b, the driving circuit control signal wiring 105a, the power lines 103 (103R, 103C; and 103B) and the cathode wiring 12a, which are formed on the substrate 2.

As shown in FIG. 2(b), the display portion 10 is formed on the circuit element portion 14. In the display portion 10, the light emitting elements 110 and the banks 112 are formed. The organic EL display 1 shown in FIG. 3 uses a bottom emission system. Specifically, light emitted from the light emitting elements 110 toward the transparent substrate 2 passes through the circuit element portion 14 and the transparent substrate 2 and is emitted to the bottom (observation side) of the transparent substrate 2. Also, light emitted from the light emitting elements 110 toward the side opposite to the transparent substrate 2 is reflected by the cathode 12 and emitted to the bottom (observation side) of the transparent substrate 2. A top emission system may be used. In this case, the cathode 12 is made of a transparent material to emit light through the cathode 12.

Furthermore, the sealing portion 3 is provided above the display portion 10. The sealing portion 3 includes a sealing resin 603 coated on the transparent substrate 2, and a sealing substrate 604 disposed on the sealing resin 603.

The sealing substrate 604 is made of glass or a metal, and has a recess 604a provided on its inner side to receive the display portion 10 therein. Also, a getter agent 605, which absorbs moisture and oxygen, is applied to the inner surface of the recess 604a. Therefore, moisture and oxygen which enter into the sealing substrate 604 can be absorbed. The getter agent 605 may be omitted.

The sealing resin 603 includes a thermosetting resin, an ultraviolet curing resin, or the like. Particularly, an epoxy resin is preferred. The sealing resin 603 is coated in the form of a ring on the periphery of the transparent substrate 2 by using, for example, a micro dispenser or the like. The transparent substrate 2 and the sealing substrate 604 are bonded together with the sealing resin 603, thereby hermetically sealing the sealing substrate 604. As a result, a light emitting layer (not shown in the drawing) and the cathode 12 formed in the display portion 10 can be reduced or prevented from being oxidized.

Circuit Element Portion

FIG. 3 is an enlarged view of the display region shown in FIG. 2(b). In FIG. 3, the circuit element portion 14 including the thin film transistors 123, the various wirings, etc., and the display portion 10 including the light emitting elements 110 and the banks 112 are laminated in turn on the transparent substrate 2 made of glass or the like.

Also, an underlying protective film 2c is formed on the surface of the transparent substrate 2. As described below, the underlying protective film 2c includes a first underlying protective film composed of silicon nitride (SiN), and a second underlying protective film composed of silicon oxide (SiO$_2$). Furthermore, semiconductor films 141 composed of polycrystalline silicon (p—Si) are formed in a matrix on the surface of the underlying protective film 2c. Each of the semiconductor films 141 has a source region 141b and a drain region 141a which are formed by implanting a high concentration of phosphorus (P) ions. The remaining portion in which a high concentration of P ions is not implanted becomes a channel region 141c.

Furthermore, a transparent gate insulating film 142 composed of silicon oxide (SiO$_2$) is formed to cover the underlying protective film 2c and the semiconductor films 141. Wiring is formed on the surface of the gate insulating film 142 by using p—Si, Al, Mo, Ta, Ti, W, or the like. The portions of the wiring, which face the respective channel regions 141c, serve as gate electrodes 143. As described above, the second thin film transistor 123 is formed in the periphery of each of the semiconductor films 141 in the circuit element portion 14. Although the first thin film transistors 122 and the hold capacitors cap are also formed in the circuit element portion 14, these elements are not shown in FIG. 3.

Transparent first and second interlayer insulating films 144a and 144b, each composed of silicon oxide (SiO$_2$), are formed to cover the gate electrodes 143 and the gate insulating film 142. Also, contact holes 146 and 145 are formed to extend from the surfaces of the first and second interlayer insulating films 144a and 144b to the source region 141c and the drain region 141a, respectively, of each semiconductor film 141. Furthermore, the power lines 103, composed of Al, Mo, Ta, Ti, W, or the like, are formed on the surface of the first interlayer insulating film 144a. The power lines 103 are extended into the contact holes 146 and connected to the source regions 141c of the second thin film transistors 123.

The transparent pixel electrodes 111, composed of ITO or the like, are formed on the surface of the second interlayer insulating film 144b. Each of the pixel electrodes 111 is patterned into a substantially rectangular planar shape. The thickness of each pixel electrode 111 may be 50 to 200 nm, and more preferably about 150 nm. Each of the pixel electrodes 111 is extended into the contact hole 145 and is connected to the drain region 141a of the corresponding second thin film transistor 123.

Display Portion

The display portion 10 is formed on the circuit element portion 14. The display portion 10 includes the pixel electrodes 111 formed on the second interlayer insulating film 144b, the light emitting elements 110 laminated on the surfaces of the respective pixel electrodes 111, the banks 112 disposed between the adjacent light emitting elements 110 for partitioning the respective light emitting elements 110, and the cathode 12 formed on the surfaces of the light emitting elements 110 and the banks 112. The light emitting elements 110 of red (R), green (G) and blue (B) are respectively formed in the three pixel regions A shown in FIG. 3.

Each of the banks 112 includes an inorganic bank layer 112a (first bank layer) formed on the surface of the second interlayer insulating film 144b, and an organic bank layer 112b (second bank layer) formed on the surface of the inorganic bank layer 112a. The inorganic bank layers 112a and the organic bank layers 112b have spaces formed as apertures 112g at the positions of the respective pixel electrodes 111.

The inorganic bank layers 112a are formed between the adjacent pixel electrodes 111 on the surface of the second interlayer insulating film 144b. The edges of each inorganic bank layer 112a overlap with the edges of each pixel electrode 111 to form first laminated portions 112e at the overlap positions. The inorganic bank layers 112a have spaces formed as lower apertures 112c to expose the surfaces of the respective pixel electrodes 111.

Each of the inorganic bank layers 112a is made of an inorganic material, for example, SiO$_2$, TiO$_2$, or the like. The thickness of each inorganic bank layer 112a may be in the range of 50 to 200 nm, and preferably 150 nm. This is because with a thickness of less than 50 nm, the inorganic bank layers 112a are thinner than the hole injection/transport layers 110a described below. Thus flatness of the hole injection/transport layers 110a cannot be secured. With a thickness of over 200 nm, steps formed in the lower apertures 112c become large to possibly fail to secure the flatness of the light emitting layers 110b formed on the hole injection/transport layers 110a.

The organic bank layers 112b are formed on the surfaces of the respective inorganic bank layers 112a. The organic bank layers 112b have spaces formed as upper apertures 112d above the respective pixel electrodes 111. Since each of the apertures 112g has the inclined sides, the upper apertures 112d are wider than the lower apertures 112c. Each of the organic bank layers 112b is made of a heat-resistant and solvent-resistance material, such as an acryl resin, a polyimide resin, or the like. The thickness of each organic bank layer 112b may be in the range of 0.1 to 3.5 $\mu$m, and preferably about 2 $\mu$m. This is because with a thickness of less than 0.1 $\mu$m, the organic bank layers 112b become thinner than the total of the hole injection/transport layers 110a and the light emitting layers 110b, thereby possibly causing protrusion of the light emitting layers 110b from the respective upper apertures 112d. With a thickness of over 3.5 $\mu$m, the steps formed in the upper apertures 112d become large to possibly fail to secure step coverage of the cathode 12 formed on the organic bank layers 112b. The thickness of each organic bank layer 112b may be 2 $\mu$m or more because insulation from the second thin film transistors 123 can be increased.

Also, the banks 112 have lyophilic regions and liquid-repellent regions. The lyophilic regions include the electrode surfaces 111a of the pixel electrodes 111 and the first laminated portions 112e of the inorganic bank layers 112a. These regions are subjected to a lyophilic surface treatment by a plasma treatment with oxygen used as a treatment gas. On the other hand, the liquid-repellent regions include the wall surfaces of the upper apertures 112d and the top surfaces 112f of the organic bank layers 112b. These regions are subjected to a fluorination surface treatment (liquid-repellent treatment) by a plasma treatment with tetrafluoromethane or carbon tetrafluoride used as a treatment gas. If the organic bank layers 112b are made of a material containing a fluorocarbon polymer, the organic bank layers 112b exhibit liquid repellency, and thus the liquid-repellent treatment can be omitted.

The light emitting elements 110 are formed on the surfaces of the respective pixel electrodes 111 within the respective apertures 112g between the banks 112. Each of the light emitting elements 110 includes the hole injection/transport layer 110a laminated on the surface of the pixel electrodes 111, and the light emitting layer 110b formed on the surface of the hole injection/transport layer 110a. Also, a functional layer, such as an electron injection/transport layer, may be formed between each light emitting layer 110b and the cathode 12.

Each of the hole injection/transport layers 110a includes a flat portion 110a1, which is formed on the electrode surface 111a of each pixel electrode 111 within each lower aperture 112c, and peripheral portions 110a2 which are formed in each upper aperture 112d and on the surfaces of the respective first laminated portions 112e of each inorganic bank layer 110b. Each of the hole injection/transport layers 110a may include only the flat portion 110a1. The flat portions 110a1 are formed to a constant thickness, for example, in the range of 50 to 70 nm. The hole injection/transport layers 110a have an injection/transport function for the light emitting layers 110b. By providing the hole injection/transport layers 110a, the element characteristics, such as the emission efficiency and life of the lighting layers 110b, can be enhanced.

The peripheral portions 110a2 are formed to adhere to the surfaces of the first laminated portions 112e and to the side surfaces of the upper apertures 112d of the organic bank layers 112b. The thickness of each peripheral portion 110a2 is small near the corresponding electrode surface 111a, gradually increases in a direction away from the electrode surface 111a and becomes the maximum near the wall surface of the upper aperture 112d. The reason why the peripheral portions 110a2 have the above-described shape is that the hole injection/transport layers 110a are formed by discharging a solution of a hole injection/transport layer material in a polar solvent into the apertures 112 and then removing the polar solvent. The polar solvent mainly evaporates from the portions on the first laminated portions 112e of the inorganic bank layers to intensively concentrate and deposit the hole injection/transport layer material on the first laminated portions 112e.

Each of the light emitting layers 110b emits light due to recombination of holes injected from the corresponding hole injection/transport layer 110a and electrons injected from the cathode 12. As described below, the light emitting layers 110b composed of a polymer material include the three types of layers including a red light emitting layer emitting red (R) light, a green light emitting layer emitting green (G) light, and a blue light emitting layer emitting blue (B) light. Only the light emitting layer emitting light of any one of the colors is formed in each of the light emitting elements 112g, and the apertures 110 in which the light emitting layers of each color are formed and arranged in a matrix above the transparent substrate 2.

Since the electrode surfaces 111a of the pixel electrodes 111 and the surfaces of the first laminated portions 112e of the inorganic bank layers 112a exhibit lyophilicity, the hole injection/transport layer 110a and the light emitting layer 110b, which constitute each light emitting element 110, are uniformly formed on the electrode surface 111a of the corresponding pixel electrode 111 and on the surfaces of the first laminated portions 112e of the corresponding inorganic bank layer 112a. Therefore, the light emitting elements 110 do not become excessively thin above the respective inorganic bank layers 112a, thereby reducing the likelihood or preventing a short circuit between each pixel electrode 111 and the cathode 12. The wall surfaces of the upper apertures 112d and the top surfaces 112f of the organic bank layers 112b exhibit liquid repellency. Thus adhesion between the light emitting elements 110 and the organic bank layers 112b is decreased to reduce or prevent protrusion of the light emitting elements 110 from the respective apertures 112g.

The cathode 12 is formed on the surfaces of the light emitting elements 110 and paired with the pixel electrodes 111, to supply a current to the light emitting elements 110. In this exemplary embodiment, the cathode 12 is formed over the entire surface of the display portion 10. As described below, the cathode 12 includes LiF/Al (laminated films of LiF and Al), MgAg, or LiF/Ca/Al (laminated films of LiF, Ca and Al). The total thickness of the cathode (counter electrode) 12 is about 5 to 500 nm, and preferably about 200 nm.

Furthermore, an antioxidative protective layer composed of SiO, SiO$_2$, SiN, or the like may be provided on the surface of the cathode 12.

The sealing substrate 604 shown in FIG. 2(b) is bonded to be disposed above the display portion 10 formed as described above to form the organic EL display 1.

Underlying Protective Film

Figure 4:
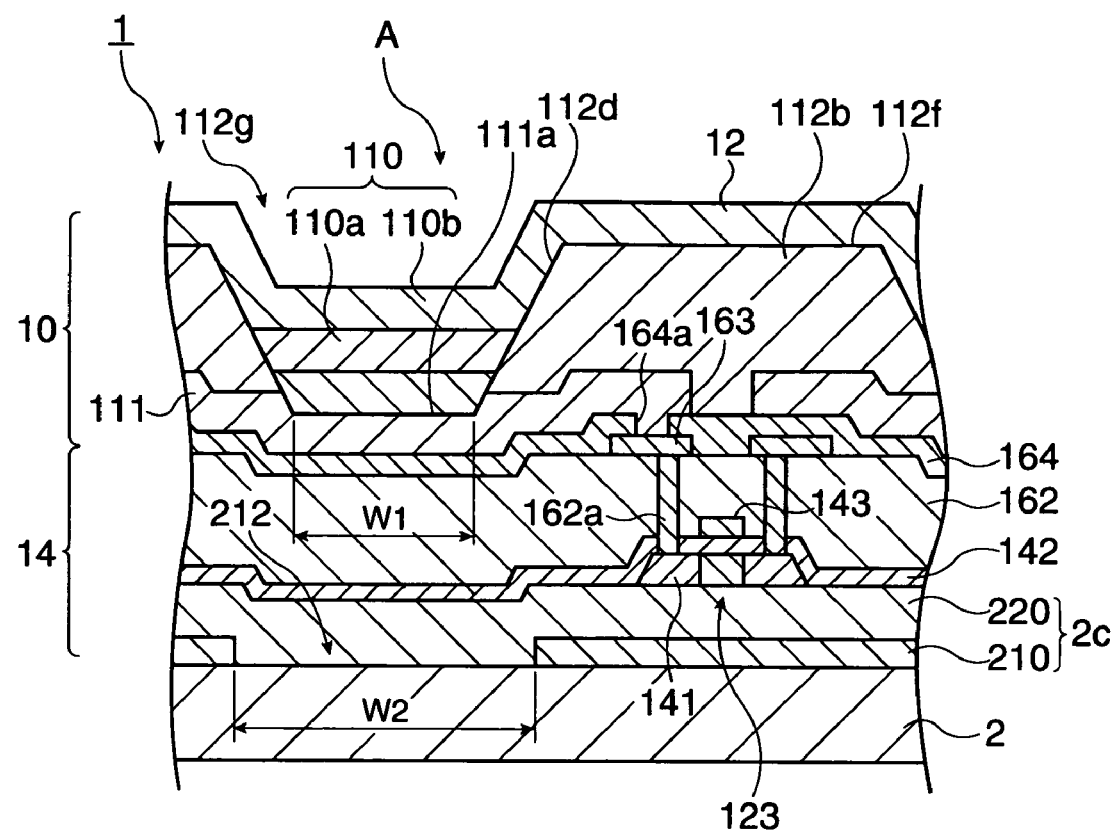
FIG. 4 is an enlarged view of the periphery of an underlying protective film of an organic EL display according to a first exemplary embodiment.

FIG. 4 is an enlarged view showing the periphery of the underlying protective film of the organic EL display of this exemplary embodiment. The first interlayer insulating film 162 shown in FIG. 4 corresponds to the first interlayer insulating film 144a and the second interlayer insulating film 144b shown in FIG. 3. In FIG. 4, relay electrodes 163 including a metal material, such as Al, Cu, or the like, are formed on the surface of the first interlayer insulating film 162 and are connected to second thin film transistors 123 through contact holes 162a. Also, a second interlayer insulating film 164 is formed to cover the first interlayer insulating film 162 and the relay electrodes 163. Furthermore, the pixel electrodes 111 are formed on the surface of the second interlayer insulating film 164 and are connected to the relay electrodes 163 through contact holes 164a. Furthermore, the organic bank layers 112b are formed above the relay electrodes 163 without inorganic bank layers.

In the organic EL display of this exemplary embodiment, the underlying protective film 2c includes a first underlying protective film 210 composed of silicon nitride (SiN) and a second underlying protective film 220 composed of silicon oxide ($SiO_2$). The first underlying protective film 210 made of silicon nitride is formed on the surface of the transparent substrate 2. Silicon nitride has the same degree of resistivity as that of silicon oxide and a denser molecular structure than that of silicon oxide. Therefore, a silicon nitride film can restrict movable ion migration which cannot be completely prevented by a silicon oxide film. Accordingly, when the underlying protective film includes a silicon nitride film, the thickness can be decreased, as compared with an underlying protective film including only a silicon oxide film. For example, the thickness of the first underlying protective film 210 may be set to 40 to 100 nm. Therefore, the organic EL display can be thinned.

The silicon nitride film is not completely transparent, but assumes a light blue color. Therefore, when light emitted from the light emitting devices 110 passes through the silicon nitride film and is emitted to the bottom (observation side) of the transparent substrate 2, a blue color is added to the light emitted from the light emitting elements 110. As a result, light transmittance is decreased, and the organic EL display cannot display an accurate color. Therefore, apertures 212 are formed in the first underlying protective film 210 in correspondence with the positions of the respective light emitting elements 110 serving as display elements. In this case, light emitted from the light emitting elements 110 passes through the apertures 212 and is emitted from the bottom (observation side) of the transparent substrate 2 without passing through the silicon nitride film. Therefore, light emitted to the light emitting elements 110 is emitted without any change. Consequently, a decrease in light transmittance can be reduced or prevented, and the organic EL display can display an accurate color.

As described below, the apertures 212 are formed by photolithography. In the photolithography process, a resist coated over the entire surface of the transparent substrate 2 is exposed to light through a photomask having a pattern of the apertures 212 to pattern the resist. In this process, alignment marks must be formed separately for alignment of the photomask. The open size W2 of each aperture 212 is larger than the emission size W1 corresponding to the display size of each light emitting element 110 serving as a display element. In this case, even when the positions of the apertures 212 are shifted from the positions of the light emitting elements 110, light emitted from the light emitting elements 110 is not incident on the first underlying protective film 210. Therefore, in the photolithography process, the resist can be patterned through the photomask aligned with the transparent substrate 2 without using the alignment marks.

As a result, the alignment marks need not be formed separately to simplify the manufacture process.

Furthermore, the second underlying protective film 220 made of silicon oxide ($SiO_2$) is formed on the surface of the first underlying protective film 210. Since the second underlying protective film 220 is disposed in the apertures 212 formed in the first underlying protective film 210, recesses are formed on the surface of the second underlying protective film 220. The above-described gate insulating film 142, first interlayer insulating film 162, second interlayer insulating film 164 and pixel electrodes 111, are formed on the surface of the second underlying protective film 220. Thus recesses are also formed on the surfaces of the respective pixel electrodes 111. The hole injection/transport layers 110a and the light emitting layers 110b are disposed at the bottoms of the recesses to form the light emitting elements 110 serving as the display elements. The light emitting elements 110 are disposed nearer to the transparent substrate 2 by a length corresponding to the thickness of the first underlying protective film 210 in comparison to a case in which the first underlying protective film 210 has no aperture 212. Therefore, the height of the organic bank layers 112b can be decreased by a length corresponding to the thickness of the first underlying protective film 210. As a result, the organic EL display can be thinned.

Exemplary Manufacturing Method

Next, an exemplary method to manufacture the above-descried organic EL display 1 will be described with reference to FIG. 4. The method to manufacture the organic EL display of this embodiment includes forming the underlying protective film, forming the semiconductor films, forming the gate insulating film and the gate electrodes, forming the thin film transistors, forming the first interlayer insulating film, forming the relay electrodes and the second interlayer insulating film, forming the pixel electrodes, forming the organic bank layers, plasma treatment, forming the light emitting elements, forming the cathode, and sealing. The method to manufacture the organic EL display is not limited to the method described below, and other steps may be added, or some of the steps may be removed according to demand.

(1) Forming Underlying Protective Film

First, the first underlying protective film 210 made of silicon nitride is deposited over the entire surface of the transparent substrate 2. The silicon nitride film is formed by producing $Si_3N_4$ or the like using, for example, silane ($SiH_4$) and ammonia ($NH_3$) as reaction gases.

The deposition is preferably performed by a plasma excitation CVD method (PE-CVD). In the PE-CVD method, the reaction gases are excited by plasma discharge to effect a reaction. According to specific procedures, the transparent substrate 2 is placed in a chamber of a PE-CVD apparatus, and the reaction gases are supplied to induce plasma discharge. As a result, the excited reaction gases react near the surface of the transparent substrate 2 to produce $Si_3N_4$ or the like on the surface of the transparent substrate 2, forming the first underlying protective film 210. Instead of the PE-CVD method, an atmospheric pressure CVD method (AP-CVD) or low-pressure CVD method (LP-CVD) may be used.

Next, the apertures 212 are formed in the first underlying protective film 210. The apertures 212 are formed by photolithography. In the photolithography process, the first underlying protective film 210 is etched through a patterned resist mask to form the apertures 212. In order to pattern a resist, the resist is first coated over the entire surface of the first underlying protective film 210. Next, the coated resist is exposed through the photomask having a pattern corresponding to the apertures 212. The exposed resist is developed to pattern the resist into the shape of the apertures 212.

Figure 5:
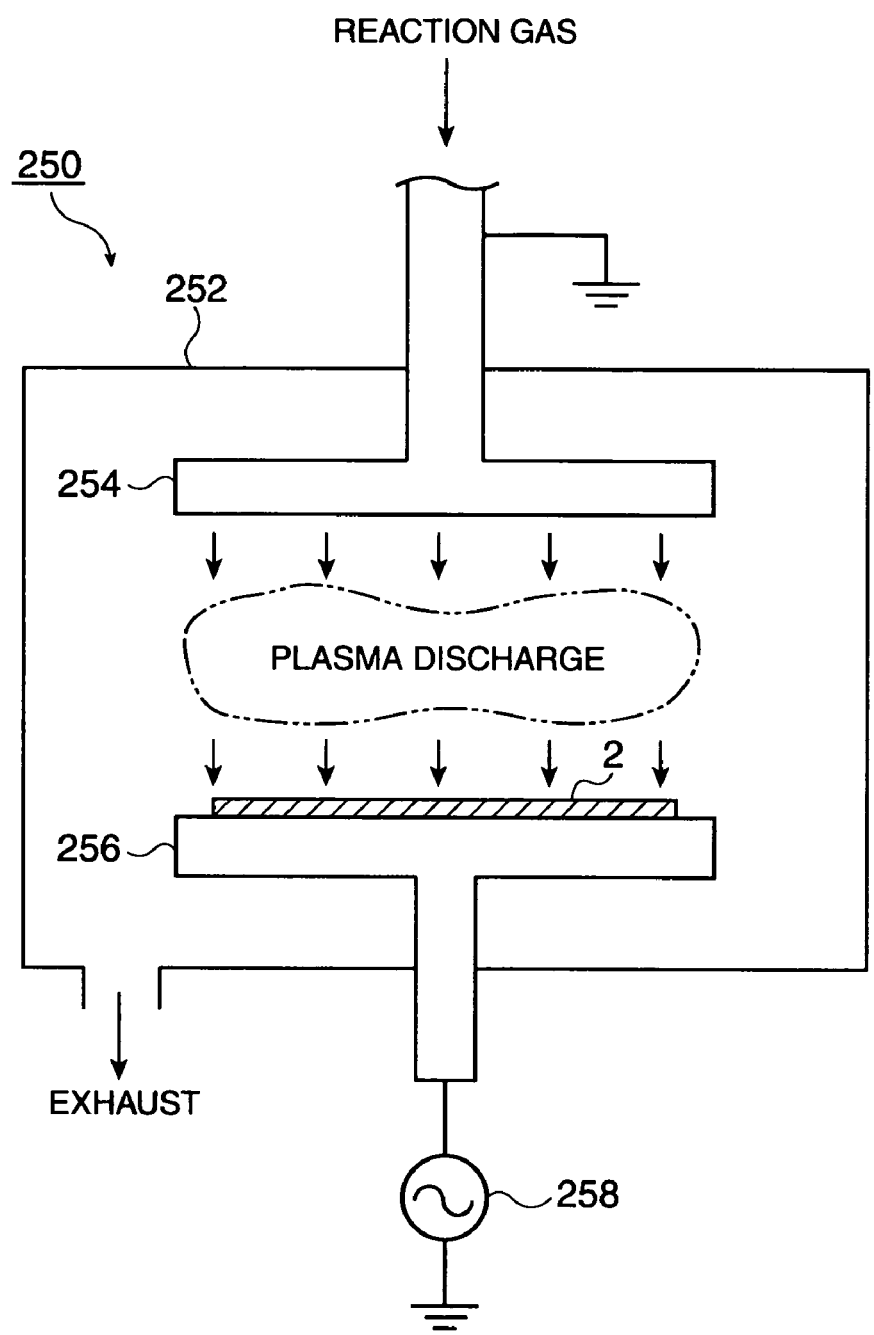
FIG. 5 is a schematic illustrating a reactive ion etching apparatus.

The first underlying protective film 210 can be etched by dry etching with an etchant, such as carbon tetrafluoride ($CF_4$) or the like. As the dry etching, reactive ion etching (RIE) is preferably used. FIG. 5 is a drawing illustrating a reactive ion etching apparatus. In reactive ion etching, a coating on the surface of a substrate is etched by a composite function of etching due to a chemical reaction between the coating and chemical active species and physical etching due to the collision of the active species with the coating surface.

FIG. 5 is a drawing illustrating a reactive ion etching apparatus. A reactive ion etching apparatus 250 includes a chamber 252. In the chamber 252, a lower electrode 256 connected to a RF (Radio-Frequency) power supply 258 is opposed to a grounded upper electrode 254. The upper electrode 254 is formed so that a reaction gas can be introduced into its top and discharged from its electrode surface. The lower electrode 256 is formed so that the transparent substrate 2 can be mounted on its electrode surface. An exhaust port is formed at the bottom of the chamber 252.

The reactive ion etching is performed according to the following procedures. First, the transparent substrate 2 is mounted on the electrode surface of the lower electrode 256 within the chamber 252 of the reactive ion etching apparatus 250. Next, $CF_4$ gas is introduced as a reaction gas from the top of the upper electrode 254. Then, RF is applied to the lower electrode 256 to induce plasma discharge between both electrodes. As a result, the $CF_4$ gas reaching the plasma discharge region is excited to generate F radicals (fluorine active species) which reach the surface of the transparent substrate 2 to which RF is applied. On the surface of the transparent substrate 2, the first underlying protective film made of silicon nitride reacts with the F radicals to produce silicon tetrafluoride ($SiF_4$), which is a volatile compound and which is released from the surface of the transparent substrate 2. Since an ion sheath (space charge layer) is formed near the surface of the transparent substrate 2 by RF application, the F radicals are subjected to an accelerating voltage to collide with the transparent substrate 2. As a result, the first underlying protective film 210, made of silicon nitride, is etched by a composite function with the sputtering etching effect, as shown in FIG. 4. Since the portions other than the apertures 212 are masked with the resist, the portions corresponding to the apertures 212 are etched to form the apertures 212 in the first underlying protective film 210.

The first underlying protective film 210, made of silicon nitride, may be etched by wet etching. In this case, the transparent substrate 2 is dipped in an etching solution containing phosphoric acid at high temperature. Since the etching solution has a high temperature, a silicon oxide film is used as an etching mask instead of the resist.

Next, the second underlying protective film 220, made of silicon oxide, is formed on the surface of the first underlying protective film 210. The silicon oxide film can be formed by PE-CVD using silane and oxygen ($O_2$) as reaction gases. Also, tetraethoxysilane (TEOS: $Si(OC_2H_5)_4$) and ozone ($O_3$) may be used as reaction gases. Instead of PE-CVD, AP-CVD or LP-CVD may be used.

(2) Forming Semiconductor Films

Next, the semiconductor films 141 composed of polycrystalline silicon (p—Si) are formed on the surface of the second underlying protective film 220. According to specific procedures, an amorphous silicon (a—Si) film is first formed over the entire surface of the second underlying protective film 220. The a—Si film can be formed by PE-CVD or the like using silane as a reaction gas. Then, the a—Si film is heat-melted by irradiation with an excimer laser (wavelength 308 nm), and then recrystallized by cooling to form p—Si at a low temperature. Next, the p—Si film is implanted with boron (B) ions. Furthermore, the p—Si film is patterned by photolithography. The p—Si film can be patterned by dry etching with a $CF_4$ gas used as an etchant. As a result, the semiconductor films 141 are formed in a matrix on the surface of the second underlying protective film 220.

(3) Forming Gate Insulating Film and Gate Electrodes

Next, the gate insulating film 142 is formed on the surfaces of the semiconductor films 141. The gate insulating film is formed by a method in which the transparent substrate 2 is placed in a high-temperature oxidizing atmosphere to thermally oxidize the surfaces of the semiconductor layers 141. In addition, a silicon oxide film may be formed by LP-CVD or the like. Then, the gate electrodes 143 composed of p—Si are formed on the surface of the gate insulating film 142. According to specific procedures, a p—Si film is first formed on the entire surface of the gate insulating film 142. Then the p—Si film is patterned by photolithography to form the gate electrodes 143 on the surface of the gate insulating film 142.

(4) Forming Thin Film Transistors

Next, the source region 141b and the drain region 141a are formed in each semiconductor film 141 (refer to FIG. 3). Specifically, each of the semiconductor films 141 is implanted with a high concentration of phosphorus (P) ions through the gate electrode 143 used as a mask. After a high concentration of P ions is implanted, annealing is performed to recover crystallinity of silicon. As a result, the source regions 141b and the drain regions 141a are formed in the portions in which a high concentration of P ions is introduced. The channel regions 141c are formed in the portions in which a high concentration of P ions is not introduced (refer to FIG. 3). Consequently, the second thin film transistors 123 are formed.

(5) Forming First Interlayer Insulating Film

Next, the first interlayer insulating film 162, composed of silicon oxide, is formed to cover the gate insulating film 142 and the gate electrodes 143. A silicon oxide film can be formed by the same PE-CVD method as that used for the second underlying protective film. Then, the contact holes 162a are formed above the source region and drain region of each of the second thin film transistors 123. The contact holes 162a can be formed by photolithography and dry etching. The dry etching is preferably performed by reactive ion etching using $CF_4$ as an etchant.

(6) Forming Relay Electrodes and Second Interlayer Insulating Film

Next, the relay electrodes 163 composed of a metal material, such as Al, Cu, or the like, are formed on the surface of the first interlayer insulating film 162. The relay electrodes 163 are formed by sputtering through a resist pattern used as a mask. In this step, the contact holes 162a are also filled with the metal material. Next, the second interlayer insulating film 164, composed of silicon oxide, is formed to cover the first interlayer insulating film 162 and the relay electrodes 163. A silicon oxide film can be formed by the same PE-CVD method as that used for the first interlayer insulating film 162. Then, the contact holes 164a are formed above the respective relay electrodes 163 connected to the drain regions of the second thin film transistors 123. Like in the first interlayer insulating film 162, the contact holes 164a can be formed by photolithography and dry etching. As a result, the circuit element portion 14 is formed.

(7) Forming Pixel Electrodes

Next, the pixel electrodes 111, composed of ITO or the like, are formed on the surface of the second interlayer insulating film 164. According to specific procedures, an ITO film is first formed over the entire surface of the second interlayer insulating film 164. The ITO film is formed by a vacuum deposition method. The vacuum deposition method includes evaporating ITO by heating an ITO sintered compact in vacuum to deposit ITO on the surface of the second interlayer insulating film 164. In this step, the contact holes 164a are also filled with ITO. Next, the ITO film is patterned by photolithography and dry etching. As a result, the pixel electrodes 111 are formed on the surface of the second interlayer insulating film 164. Since the second underlying protective film 220 is disposed in the apertures 212 formed in the first underlying protective film 210, recesses are formed on the surface of the second underlying protective film 220. The gate insulating film 142, the first interlayer insulating film 162, the second interlayer insulating film 164 and the pixel electrodes 111 are formed on the surface of the second underlying protective film 220. Thus recesses are formed on the surfaces of the respective pixel electrodes 111.

(8) Forming Organic Bank Layers

Next, the organic bank layers 112b, made of a polyimide resin or the like, are formed above the respective second thin film transistors 123. According to specific procedures, a polyimide resin film is first formed over the entire top surface of the transparent substrate 2. Next, the polyimide resin film is patterned by photolithography and dry etching. As a result, the apertures 112g are formed above the respective pixel electrodes 111.

(9) Plasma Treatment

Next, the surfaces of the pixel electrodes 111 and the organic bank layers 112b are subjected to a plasma treatment. The plasma treatment is performed to activate the surfaces of the pixel electrodes 111 and make the surfaces of the pixel electrodes 111 and the organic bank layers 112b lyophilic and liquid-repellent. Particularly, the activation of the surfaces of the pixel electrodes 111 is mainly performed to clean the surfaces and adjusting the work function of the pixel electrodes 111.

As a pre-treatment of the plasma treatment, the transparent substrate 2 is pre-heated to a predetermined temperature. The predetermined temperature is the temperature of a stage on which the transparent substrate 2 is disposed in the next plasma treatment step, for example, about 70° C. to 80° C. In this way, when the transparent substrate 2 is pre-heated for the next step, variations in the temperature of the transparent substrate 2 can be removed in the plasma treatment step, thereby permitting a uniform plasma treatment. Therefore, the light emitting elements 110 can be uniformly formed, and the characteristics of the organic EL display can be made uniform. Also, pre-heating of the transparent substrate 2 can decrease the treatment time in the next plasma treatment step.

Figure 6:
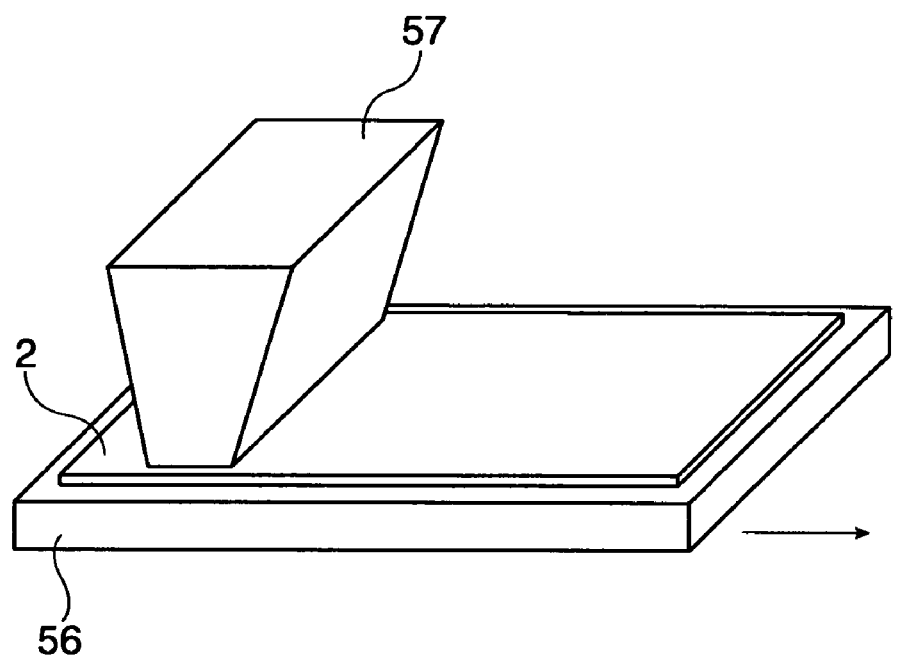
FIG. 6 is a schematic illustrating a first plasma treatment apparatus.

Next, a first plasma treatment is performed to activate the surfaces of the pixel electrodes 111 and make the surfaces of the pixel electrodes 111 and the organic bank layers 112b lyophilic. As the first plasma treatment, a plasma treatment ($O_2$ plasma treatment) is preformed with an oxygen gas used as a treatment gas under the atmospheric pressure or vacuum. FIG. 6 is a schematic showing a first plasma treatment apparatus. As shown in FIG. 6, the transparent substrate 2 is mounted on a sample stage 56 containing a heater. Heating by the sample stage 56 is performed mainly to keep the pre-heated transparent substrate 2 warm. Also, a plasma discharge electrode 57 is opposed to the transparent substrate 2 with a gap of about 0.5 mm to 2 mm therebetween. The transparent substrate 2 is transported by the sample stage 56 at a predetermined speed in the direction shown by an arrow under heating by the sample stage 56. At the same time, the transparent substrate 2 is irradiated with plasmatic oxygen gas. The conditions for $O_2$ plasma treatment include, for example, a plasma power of 100 kW to 800 kW, an oxygen gas flow rate of 50 to 100 ml/min, a transparent substrate transfer rate of 0.5 to 10 mm/sec, and a transparent substrate temperature of 70° C. to 90° C.

In the first plasma treatment, the electrode surfaces 111a of the pixel electrodes 111 are cleaned, and the work function is adjusted. Also, hydroxyl groups are introduced into the electrode surfaces 111a of the pixel electrodes 111 and the surfaces of the organic bank layers 112b to impart lyophilicity to these surfaces.

Next, a second plasma treatment is performed to make the surfaces of the organic bank layers 112b liquid-repellent. As the second plasma treatment, a plasma treatment ($CF_4$ plasma treatment) is performed with a $CF_4$ gas used as a treatment gas under the atmospheric pressure or vacuum. A second plasma treatment apparatus has the same structure as that of the first plasma treatment apparatus shown in FIG. 6. Namely, the transparent substrate 2 is transported by the sample stage 56 at a predetermined speed in the direction shown by an arrow under heating by the sample stage 56. At the same time, the transparent substrate 2 is irradiated with plasmatic $CF_4$ gas. The conditions of $CF_4$ plasma treatment include, for example, a plasma power of 100 kW to 800 kW, a $CF_4$ gas flow rate of 50 to 100 ml/min, a transparent substrate transfer rate of 0.5 to 10 mm/sec, and a transparent substrate temperature of 70° C. to 90° C. Like in the first plasma treatment, heating by the sample stage is performed mainly to keep the pre-heated transparent substrate 2 warm. The treatment gas is not limited to the $CF_4$ gas, and another fluorocarbon gas may be used.

In the second plasma treatment, fluorine groups are introduced into the side surfaces of the upper apertures 112d of the apertures 112g and the top surfaces 112f of the organic bank layers 112b to impart liquid-repellency to these surfaces. An organic material, such as the polyimide resin, which constitutes the organic bank layers 112b is easily fluorinated by irradiation with plasmatic fluorocarbon. In this exemplary embodiment, the $O_2$ plasma treatment is performed as a pre-treatment of the $CF_4$ plasma treatment, and thus the organic bank layers 112b can be easily fluorinated.

Next, the transparent substrate 2 subjected to the plasma treatment is cooled to a controlled temperature of the next step of forming the light emitting elements. Therefore, variations in the temperature of the transparent substrate 2 can be removed in the next step of forming the light emitting elements, and the light emitting elements 110 can be uniformly formed. For example, a constant volume of a first composition containing a material to form the hole injection/transport layers 110a described below can be continuously discharged, and thus the hole injection/transport layers 110a can be uniformly formed. Therefore, the characteristics of the organic EL display can be made uniform. Also, when the transparent substrate 2 is cooled to the controlled temperature, the treatment time in the next step of forming the light emitting elements can be decreased.

(10) Forming Light Emitting Elements

Next, the light emitting elements 110 are formed on the surfaces of the respective pixel electrodes 111 within the respective apertures 112g. Each of the light emitting elements 110 includes the hole injection/transport layer 110a formed on the surface of the pixel electrode 111 and the light emitting layer 110b formed on the hole injection/transport layer 110a. The step of forming the light emitting elements is preferably performed in an atmosphere in which moisture and oxygen are absent. For example, the step is preferably performed in an atmosphere of an inert gas, such as nitrogen, argon, or the like.

Figure 7:
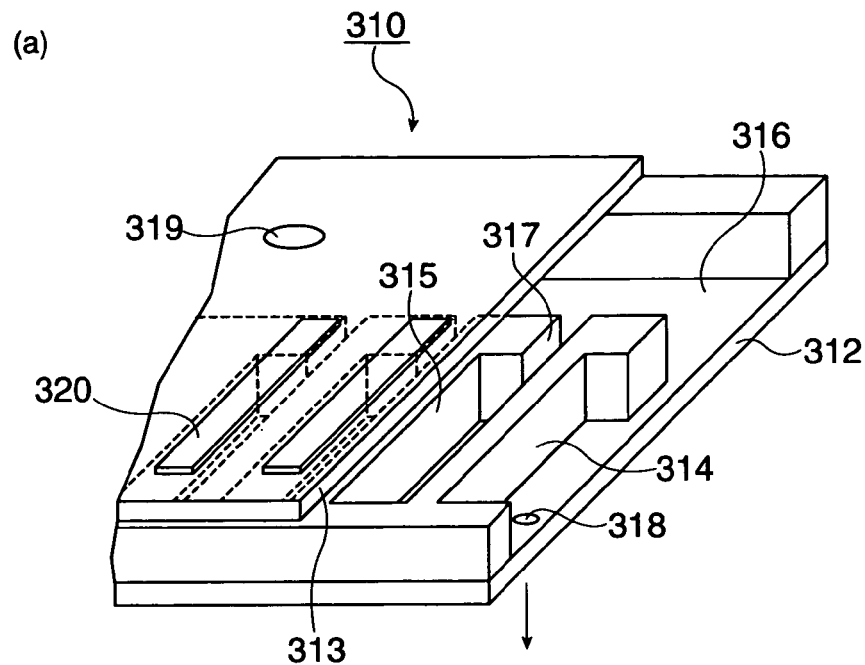
FIGS. 7(a) and 7(b) are schematics illustrating a droplet discharge apparatus.
Figure 7:
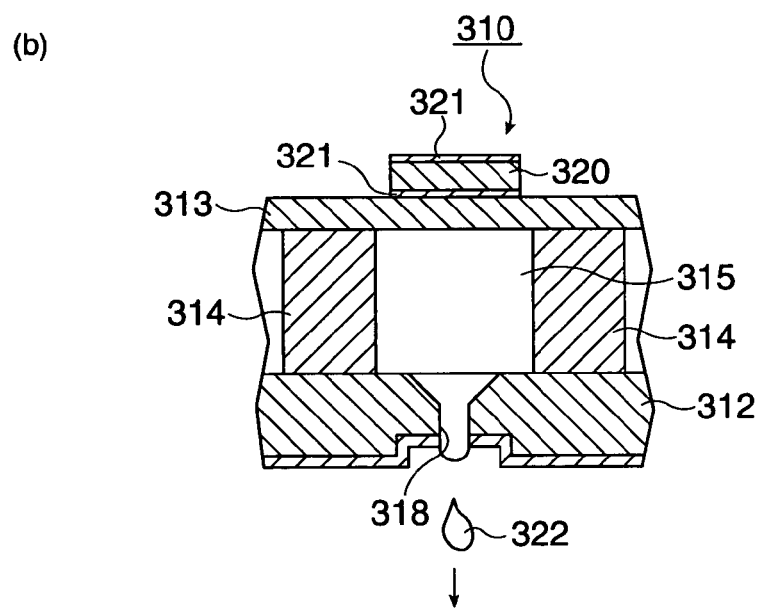

The hole injection/transport layers 110a and the light emitting layers 110b are formed by discharging droplets of a liquid containing each of forming materials toward the pixel electrodes 111. Each of the liquids is discharged by using a droplet discharge apparatus. FIG. 7 is a drawing illustrating the droplet discharge apparatus. As shown in FIG. 7(a), the droplet discharge apparatus includes a droplet discharge head 310. The droplet discharge head 310 includes a nozzle plate 312 made of, for example, stainless steel, and a vibrating plate 313, both of which are bonded together with a partition member (reservoir plate) 314 provided therebetween. Also, a liquid reservoir 316 is formed between the nozzle plate 312 and the vibrating plate 313. The vibrating plate 313 has a hole 319 to supply the liquid to the liquid reservoir 316. Furthermore, a plurality of liquid chambers 315 is formed by the partition member 314 between the nozzle plate 312 and the vibrating plate 313. Each of the liquid chambers 315 communicates with the liquid reservoir 316 by a supply port 317, the liquid reservoir 316 and each liquid chamber 315 being filled with the liquid. The nozzle plate 312 constituting the bottoms of the liquid chambers 315 has nozzle holes 318 to discharge the liquid. Since the liquid chambers 315 are arranged in a line, the nozzle holes 318 are also arranged in a line in the nozzle plate 312.

As shown in FIG. 7(b), a piezoelectric element (piezo element) 320 is bonded to the outside of a portion of the vibrating plate 313 which constitutes the top of each liquid chambers 315. Also, a pair of electrodes 321 is mounted at both end surfaces of each piezoelectric element 320 in the thickness direction. When a current is supplied to the pair of electrodes 321, the piezoelectric elements 320 contract in the thickness direction to deflect outwardly the vibrating plate 313. Accordingly, the volume of each liquid chamber 315 is increased to flow the liquid from the liquid reservoir 316 to the liquid chambers 315. Next, the supply of a current to the pair of electrodes 321 is stopped, the piezoelectric elements 320 and the vibrating plate 313 are returned to the original conditions.

As a result, the volume of each liquid chamber 315 is retuned to the original condition to increase the pressure of the liquid in each liquid chamber 315, thereby discharging droplets 322 of the liquid from each nozzle hole 318. In the droplet discharge head 310 using a piezo system, the droplets 322 are discharged as described above. As the droplet discharge system of the droplet discharge head 310, a suitable system other than the piezo system using the piezoelectric elements 320 may be used.

First, the hole injection/transport layer 110a is formed on the surface of each pixel electrode 111 by using the droplet discharge apparatus. Specifically, droplets of a liquid prepared by dissolving a material to form the hole injection/transport layers 110a in a polar solvent are discharged to the surfaces of the pixel electrodes 111. As the material to form the hole injection/transport layers 110a, for example, a mixture (BAYTRON-P; registered trade name of Bayem Corporation) of a polythiophene derivative, such as polyethylene dioxythiophene and polystyrenesulfonic acid is used. On the other hand, examples of the polar solvent include isopropyl alcohol, normal butanol, γ-butyrolactone, N-methylpyrrolidone, 1,3-dimethyl-2-imidazolidinone and its derivatives, and glycol ethers, such as carbitol acetate, butyl carbitol acetate, and the like. The materials used for forming the hole injection/transport layers 110a of the light emitting elements of red (R), green (G) and blue (B) may be the same material or different.

Such a liquid is discharged to the electrode surfaces 111a of the pixel electrodes 111 from the droplet discharge apparatus. The discharged liquid spreads in the form of a layer to the side surfaces of the apertures 112g along the electrode surfaces 111a subjected to the lyophilic treatment.

Next, drying is performed by heating or irradiation to evaporate the polar solvent contained in the liquid. Since the evaporation rate of the polar solvent is substantially constant on the electrode surfaces 111a, the material to form the hole injection/transport layers 110a is uniformly concentrated. The drying is performed, for example, at room temperature in a nitrogen atmosphere under a pressure of about 13.3 Pa to 133.3 Pa (0.1 to 1 Torr). When the pressure is abruptly decreased, the liquid bumps to fail to form a flat film. Therefore, the pressure is decreased over a predetermined time. At an elevated temperature, the evaporation rate of the polar solvent in increased to fail to form a flat film. Therefore, drying may be performed in the range of 30° C. to 80° C. After the drying, a heat treatment may be performed at 200° C. for about 10 minutes in nitrogen, in a vacuum. As a result, the polar solvent and moisture remaining in the hole injection/transport layers 110a can be removed.

As described above, the hole injection/transport layers 110a having a uniform thickness are formed on the electrode surfaces 111a of the respective pixel electrodes 111. When the hole injection/transport layers 110a having a desired thickness cannot be formed by one discharge from the droplet discharge apparatus and drying, the discharge and drying may be repeated several times.

Next, the light emitting layers 110b are formed on the surfaces of the respective hole injection/transport layers 110a. In this step, the surfaces of the hole injection/transport layers 110a are previously modified. The light emitting layers 110b are formed by a method in which droplets of a liquid prepared by dissolving a material to form the light emitting elements 110b in a nonpolar solvent are discharged to the surfaces of the hole injection/transport layers 110a by using the droplet discharge apparatus. The discharged liquid spreads in the form of a layer to the side surfaces of the apertures 112g along the surfaces of the hole injection/transport layers 110a. Since the sides of the upper apertures 112d and the top surfaces 112f of the organic bank layers 112b are subjected to the liquid-repellent treatment, the liquid discharged in one of the pixel regions A does not flow into the other pixel regions A beyond the organic bank layers 112b.

As the material to form the light emitting layers 110b, a polymer material is used. Examples of such a material include polymer materials represented by Chemical Formula 1 to Chemical Formula 5, such as polyfluorene derivatives, polyphenylene derivatives, polyvinyl carbazole, and polythiophene derivatives. Any one of these polymer materials may be doped with a perylene dye, a cumarin dye, or a rhodamine dye, for example, rubrene, perylene, 9,10-diphenylanthracene, tetraphenylbutadiene, Nile red, cumarin 6, quinacridone, or the like. Different materials are used to form the light emitting layers 110b of red (R), green (G) and blue (B) respectively. Therefore, a liquid containing the material to form the light emitting layers of one of the colors is discharged in correspondence with the color of emitted light previously assigned to each pixel region A.

(11) Forming The Cathode

Next, the cathode (counter electrode) 12 is formed over the surfaces of the light emitting layers 110b and the top surfaces 112f of the organic bank layers 112b. Specifically, LiF and Al are deposited in that order by a vapor deposition method to form the cathode 12 including laminated films (LiF/Al). A MgAg film may be formed as the cathode 12, or LiF, Ca and Al may be deposited in that order to form the Compound 1

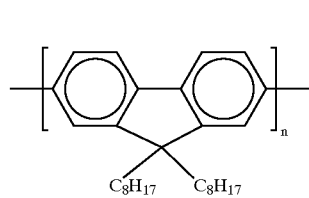

Chemical Formula 1

Compound 2

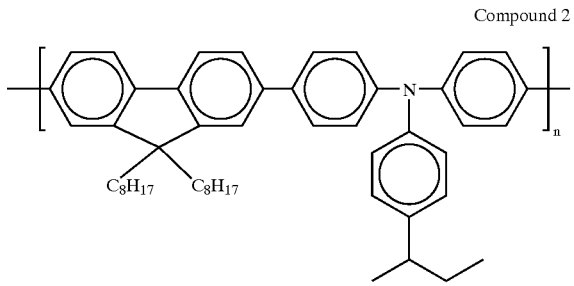

Chemical Formula 2

Compound 3

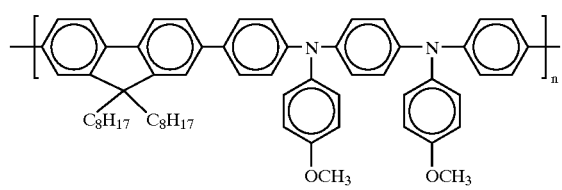

Chemical Formula 3

Compound 4

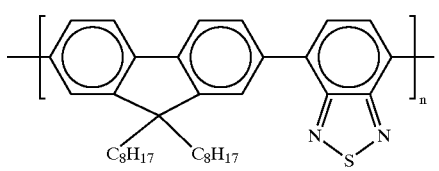

Chemical Formula 4

Compound 5

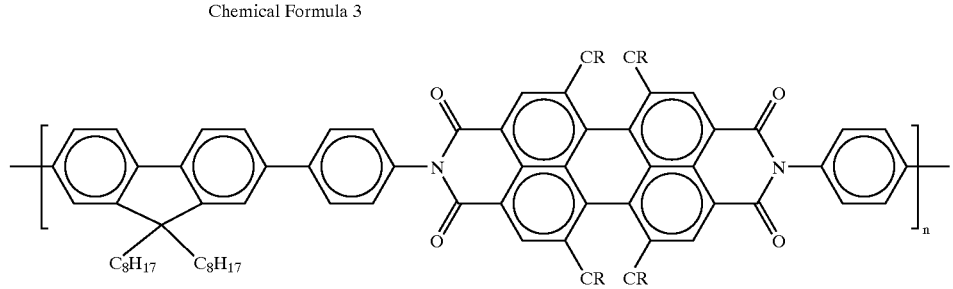

Chemical Formula 5

The nonpolar solvent may not dissolve the hole injection/transport layers 110a, and for example, cyclohexylbenzene, dihydrobenzofiran, trimethylbenzene, tetramethylbenzene, or the like can be used. The material to form the light emitting layers 110b is dissolved in such a nonpolar solvent to form a liquid, so that the liquid can be coated without re-dissolution of the hole injection/transport layers 110a.

Next, like the hole injection/transport layers 110a, the discharged liquid is dried (and heat-treated) to form the light emitting layers 110b. In this way, the light emitting layers 110b of red (R), green (G) and blue (B) are formed in the respective pixel regions A. Although, in this exemplary embodiment, the light emitting layers 110b are formed by using a polymer material, the light emitting layers 110b may be formed by a vapor deposition method using a low-molecular material. Particularly, for the light emitting layers of blue, there are many low-molecular materials superior to polymer materials from the viewpoint of the life of the light emitting layers. Therefore, a low-molecular material is preferably used to form the light emitting layers of blue.

cathode 12 including laminated films (LiF/Ca/Al). Also, for an antioxidative purpose, a protective layer made of SiO$_2$, SiN, or the like may be provided on the cathode 12 formed as described above. As a result, the display portion 10 is formed.

(12) Sealing

Finally, as shown in FIG. 2(b), the transparent substrate 2 having the light emitting elements 110 formed thereon and the sealing substrate 604 are sealed with the sealing resin 603. Specifically, a thermosetting resin or ultraviolet curing resin used as the sealing resin 603 is coated on the periphery of the transparent substrate 2 by a micro dispenser. Next, the sealing substrate 604 is placed on the sealing resin 603, and then heated or irradiated with ultraviolet rays. Consequently, the transparent substrate 2 and the sealing substrate 604 are bonded together with the sealing resin 603 to form the sealed portion 3. The sealing step is preferably performed in an inert gas atmosphere of nitrogen, argon, helium, or the like. This is because when the cathode 12 has defects, such as pinholes or the like, the sealing step in the air causes the entrance of moisture and oxygen into the cathode 12 through the defects, thereby causing oxidation of the cathode 12.

Furthermore, the cathode 12 is connected to the wiring 5a of the flexible substrate 5 shown in FIG. 2, and wiring of the circuit element portion 14 is connected to the driving IC 6 to obtain the organic EL display 1.

Second Exemplary Embodiment

Figure 8:
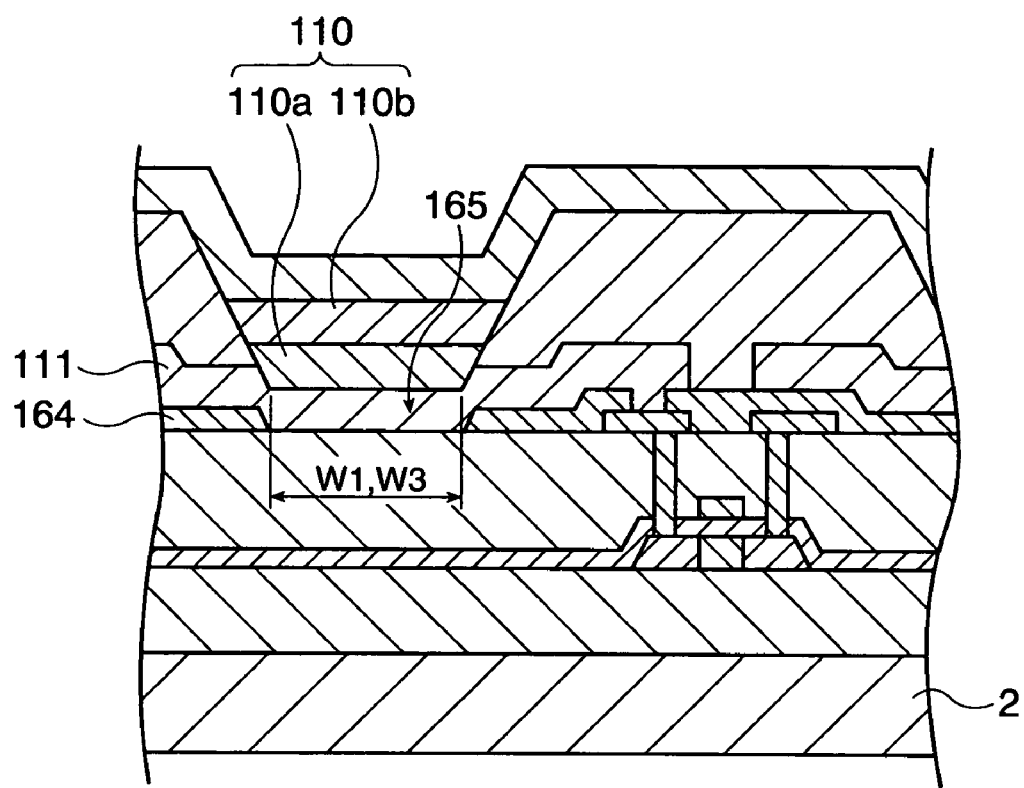
FIG. 8 is an enlarged view of the periphery of a second interlayer insulating film of an organic EL display according to a second exemplary embodiment.

Next, an organic EL display according to a second exemplary embodiment of an electro-optic device of the present invention will be described with reference to FIG. 8. FIG. 8 is an enlarged view showing the periphery of the second interlayer insulating film of the organic EL display of this exemplary embodiment. The second embodiment is different from the first embodiment only in the point that while the first exemplary embodiment uses a silicon nitride film as the first underlying protective film, the second exemplary embodiment uses a silicon nitride film as the second interlayer insulating film. The other points are the same as in the first exemplary embodiment, and the detailed description thereof is omitted.

As shown in FIG. 8, in this exemplary embodiment, a single-layer underlying protective film 2c is composed of silicon oxide, while a second interlayer insulating film 164 is composed of silicon nitride. The second interlayer insulating film 164 has apertures 165 corresponding to the positions of the respective light emitting elements 110 serving as display elements. Therefore, like in the first exemplary embodiment, light from the light emitting elements 110 passes through the apertures 165 and is emitted to the bottom (observation side) of the transparent substrate 2, and thus light from the light emitting elements is emitted without any change. Thus, a decrease in transmittance can be reduced or prevented, and the organic EL display can display an accurate color. Also, the emission size W1 corresponding to the display size of each light emitting element 110 is equal to the open size W3 of each aperture 165. When the open size W3 is equal to the emission size W1, light leakage can be reduced or prevented because the second interlayer insulating film 164 is disposed near the light emitting elements 110.

Also, the pixel electrodes 111 composed of ITO or the like are formed on the surface of the second interlayer insulating film 164. Since the pixel electrodes 111 are disposed in the respective apertures 165 formed in the second interlayer insulating film 164, the recesses are formed on the surfaces of the respective pixel electrodes 111. The hole injection/transport layers 110a and the light emitting layers 110b are disposed above the respective recesses to form the light emitting elements 110 serving as the display elements. The light emitting elements 110 are disposed nearer to the transparent substrate 2 by a length corresponding to the thickness of the second interlayer insulating film 164, as compared with a case in which the second interlayer insulating film 164 has no aperture 165. Therefore, the organic EL display can be thinned.

Electronic Apparatus

An example of an electronic apparatus including the above-described organic EL display 1 will be described. The organic EL display 1 can be used for a display portion of a cellular phone. Since the cellular phone includes the display portion using the organic EL display 1, the cellular phone has good performance that an accurate color can be displayed, and light transmittance can be secured.

Figure 9:
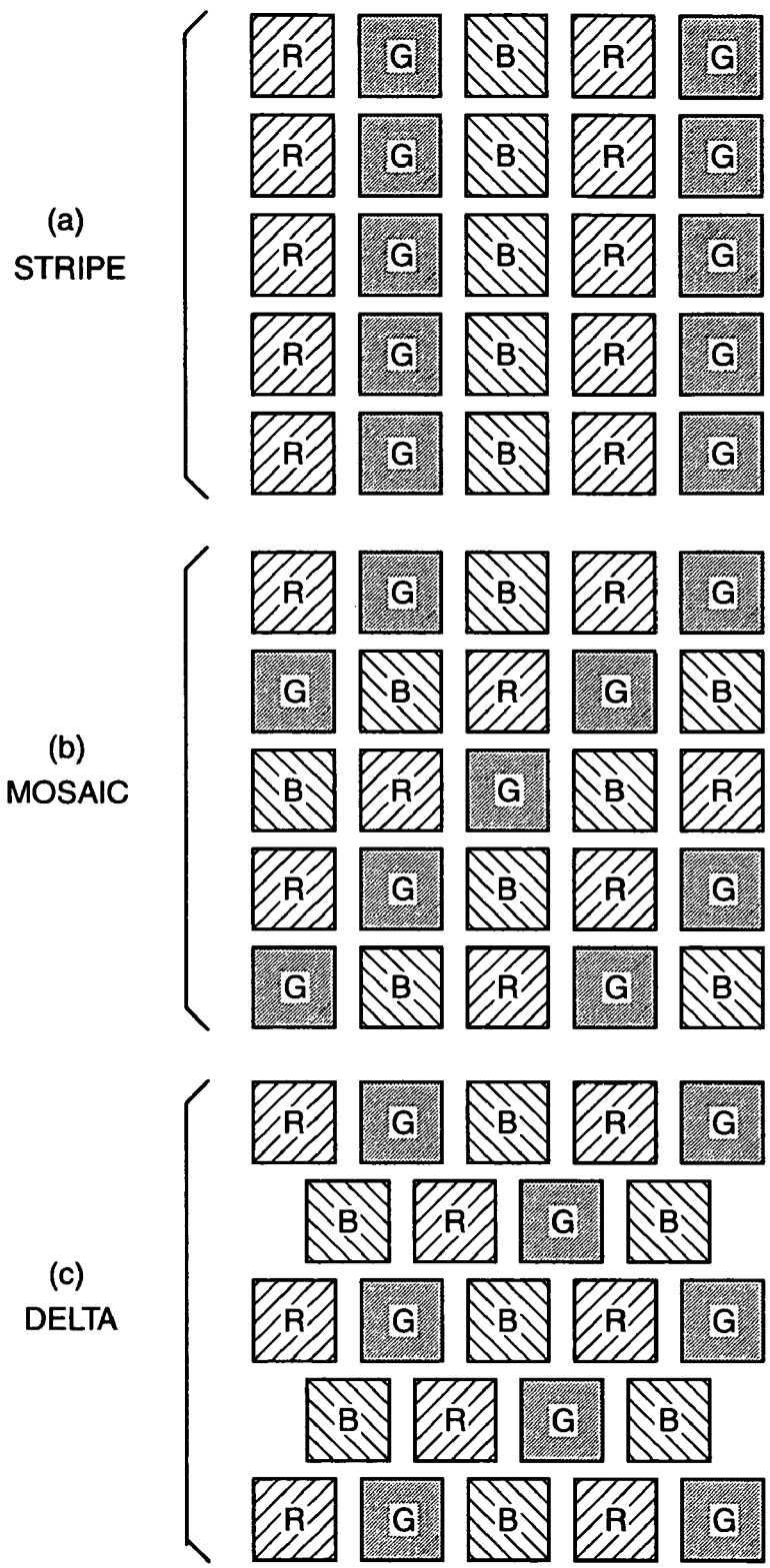
FIGS. 9(a)–9(c) are schematics showing arrangements of light emitting layers.

The technical field of the present invention is not limited to the above-described exemplary embodiments. The technical field may include various modifications within the scope of the present invention. For example, the arrangement of the light emitting layers 110b of red (R), green (G) and blue (B) is not limited to the strip arrangement shown in FIG. 9(a). The mosaic arrangement shown in FIG. 9(b) and the delta arrangement shown in FIG. 9(c) may be used. The electro-optic device of an aspect of the present invention is not limited to the organic EL display. The present invention can be applied to a liquid crystal display and a plasma display. In a liquid crystal display, a liquid crystal portion held between a pixel electrode and a counter electrode, to control polarization, is used for display elements.

What is claimed is:

1. An electro-optic device, comprising:
   a display portion having a plurality of display elements arrayed on a transparent substrate; and
   a silicon nitride film formed between the display portion and the transparent substrate,
   the silicon nitride film having a plurality of apertures corresponding to positions of the respective display elements,
   an open size of each aperture being larger than a display size of each display element.

2. The electro-optic device according to claim 1, each of the display elements being an organic EL element.

3. The electro-optic device according to claim 1, the silicon nitride film being an underlying protective film disposed between the transparent substrate and a circuit element portion including switching elements to drive the respective display elements.

4. The electro-optic device according to claim 1, the silicon nitride film being an interlayer insulating film disposed between the display elements and a circuit element portion including switching elements to drive the respective display elements.

5. The electro-optic device according to claim 4, the open size of each aperture being equal to the display size of each display element.

6. A electro-optic device, comprising:
   a display portion having a plurality of display elements arrayed on a transparent substrate;
   a silicon nitride film formed between the display portion and the transparent substrate,
   the silicon nitride film having a plurality of apertures corresponding to positions of the respective display elements; and
   pixel electrodes to supply a current to the respective display elements, the pixel electrodes having surfaces and recesses in the surfaces in correspondence with positions of the respective apertures,
   the display elements being disposed at bottoms of the respective recesses.

7. A method to manufacture an electro-optic device including a display portion having a plurality of organic EL elements arrayed on a display side of a transparent substrate, and a silicon nitride film formed between the display portion and the transparent substrate, the method comprising:
   forming the silicon nitride film on the display side of the transparent substrate;
   forming a plurality of apertures in the silicon nitride film so that the apertures correspond to positions of the respective organic EL elements;
   forming a plurality of pixel electrodes on the display side of the silicon nitride film, the pixel electrodes having recesses corresponding to positions of the respective apertures; and
   forming the organic EL elements at bottoms of the respective recesses.

8. An electronic apparatus, comprising:
the electro-optic device according to claim 1.

9. The method to manufacture an electro-optic device according to claim 7, the method comprising:
subjecting surfaces of the pixel electrodes to a lyophilic treatment; and
forming the respective organic EL elements by discharging droplets of a liquid containing each forming material toward the pixel electrode.

* * * * *